United States Patent
Braswell et al.

(10) Patent No.: US 8,847,804 B2
(45) Date of Patent: Sep. 30, 2014

(54) DELAY COMPENSATED CONTINUOUS TIME SIGMA DELTA ANALOG-TO-DIGITAL CONVERTER

(71) Applicant: Freescale Semiconductor, Inc., Austin, TX (US)

(72) Inventors: Brandt Braswell, Chandler, AZ (US); Luis J. Briones, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/668,496

(22) Filed: Nov. 5, 2012

(65) Prior Publication Data

US 2014/0125504 A1  May 8, 2014

(51) Int. Cl.
*H03M 3/00* (2006.01)
(52) U.S. Cl.
CPC ............... *H03M 3/39* (2013.01); *H03M 3/344* (2013.01)
USPC .......................................... 341/143; 341/155
(58) Field of Classification Search
CPC ................................ H03M 3/39; H03M 3/344
USPC .................................. 341/143, 144, 155, 120
See application file for complete search history.

(56) References Cited

U.S. PATENT DOCUMENTS

| 5,598,157 | A  | * | 1/1997  | Kornblum et al. | 341/120 |
|---|---|---|---|---|---|
| 6,380,874 | B1 | * | 4/2002  | Knudsen | 341/118 |
| 7,315,269 | B2 | * | 1/2008  | Schreier et al. | 341/143 |
| 7,852,249 | B2 |   | 12/2010 | Oliaei |  |
| 7,982,647 | B2 |   | 7/2011  | Souda |  |
| 8,482,443 | B2 | * | 7/2013  | Kim et al. | 341/143 |
| 8,514,117 | B2 | * | 8/2013  | Srinivasan et al. | 341/143 |
| 8,643,518 | B2 | * | 2/2014  | da Silva et al. | 341/120 |

* cited by examiner

*Primary Examiner* — Brian Young
(74) *Attorney, Agent, or Firm* — Ingrassia Fisher & Lorenz, P.C.

(57) ABSTRACT

A continuous time sigma delta analog to digital converter is provided. The continuous time sigma delta analog to digital converter may include, but is not limited to, an analog to digital converter having a feedback loop, and a feedback loop controller coupled to the analog to digital converter, the feedback loop controller configured to adjust delay in the feedback loop by controlling a variable delay component in the feedback loop.

17 Claims, 2 Drawing Sheets

DELAY COMPENSATED CONTINUOUS TIME SIGMA DELTA ANALOG-TO-DIGITAL CONVERTER

TECHNICAL FIELD

The following relates to circuits, and more particularly to continuous time sigma delta analog to digital converters.

BACKGROUND

Sigma delta modulation (otherwise known as delta signal modulation) is a method for encoding analog signals into digital signals or higher-resolution digital signals into lower-resolution digital signals. Both analog-to-digital converters (MODULATORs) and digital-to-analog converters (DACs) can employ sigma delta modulation. A sigma delta MODULATOR first encodes an input analog signal using sigma delta modulation and then applies a digital filter to form a higher-resolution digital output. The conversion is done using a feedback loop, where the difference between the two signals is measured and used to improve the conversion. The feedback loop, however, is subject to delay which can cause instability in the sigma delta MODULATOR. The delay variation due manufacturing can cause a reduction in performance.

DESCRIPTION OF THE DRAWING FIGURES

Exemplary embodiments will hereinafter be described in conjunction with the following drawing figures, wherein like numerals denote like elements.

DETAILED DESCRIPTION

According to various exemplary embodiments, a continuous time sigma delta modulator is provided. The continuous time sigma delta modulator includes a feedback loop which is used to improve the modulation. The feedback is subject to having a delay which can cause instability due to loop delay due to components or other parasitic elements. Accordingly, in one embodiment, the continuous time sigma delta modulator includes a voltage controlled delay element which removes excess delay from a feedback loop.

Figure 1:
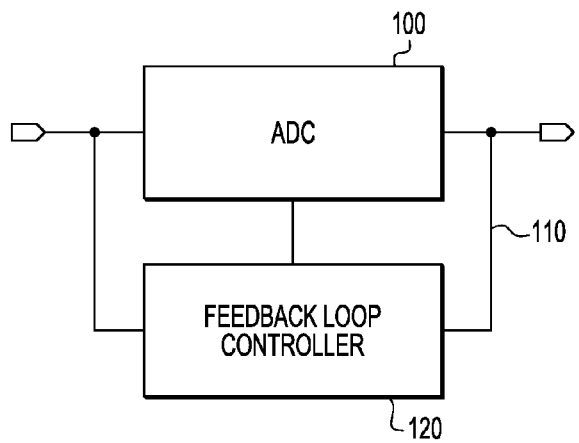
FIG. 1 is a block diagram of an exemplary continuous time sigma delta analog to digital converter, in accordance with an embodiment.

FIG. 1 is a block diagram of an exemplary continuous time sigma delta modulator 100, in accordance with an embodiment. The continuous time sigma delta modulator 100 may be used to with a digital filter to form an analog to digital converter (ADC) which converts an analog signal to a digital signal. The conversion from an analog signal to a digital signal is done using a feedback loop 110 which is used to improve the conversion. The analog signal can come from any source. The continuous time sigma delta modulator 100 may use a resistor/capacitor (RC) continuous filter, an inductor/capacitor (LC) continuous filter or a transconductance amplifier/capacitor (gm-C) continuous filter to perform sigma delta modulation. Sigma Delta modulation converts the analog voltage into a pulse frequency and is alternatively known as Pulse Density modulation or Pulse Frequency modulation.

The continuous time sigma delta modulator 100 converts the mean of an analog voltage into the mean of an analog pulse frequency and counts the pulses in a known interval so that the pulse count divided by the interval gives an accurate digital representation of the mean analog voltage during the interval. This interval can be chosen to give any desired resolution or accuracy.

The feedback loop 110 includes a digital to analog converter (DAC), as discussed in further detail below, which converts the digital output of the continuous time sigma delta modulator 100 into an analog signal which is used to improve the modulation. In one embodiment, for example, the DAC may be a non-return-to-zero (NRZ) DAC, where the output of the NRZ DAC does not return to zero after each digital input bit. An NRZ DAC can improve the jitter immunity of the continuous time sigma delta modulator 100. The feedback loop 110 would naturally have a delay such that an output pulse from the DAC in the feedback loop 110 is pushed into a subsequent period of the input signal. The delay can vary between various continuous time sigma delta modulator 100 devices based upon variations during the manufacturing process. The delay in the feedback loop 110 can also vary based upon the operating temperature continuous time sigma delta modulator 100.

In order to compensate for the delay in the feedback loop 110, the continuous time sigma delta modulator 100 also includes a feedback loop controller 120. The feedback loop controller 120 uses a voltage configurable delay element to optimize the amount of delay in the feedback loop 110. In many cases the feedback loop controller will remove excess delay from the feedback loop 110. However, in some cases the feedback loop controller 120 may add delay if there isn't enough delay in the feedback loop 110. In higher order loops, the delay optimization point can be within a very narrow range which can be predetermined by the system and be based upon the operation conditions of the continuous time sigma delta modulator 100. Accordingly, the feedback loop controller 120 optimizes that delay by using a voltage configurable delay element to adjust the delay within the feedback loop 110 to be within the predetermined range.

Figure 2:
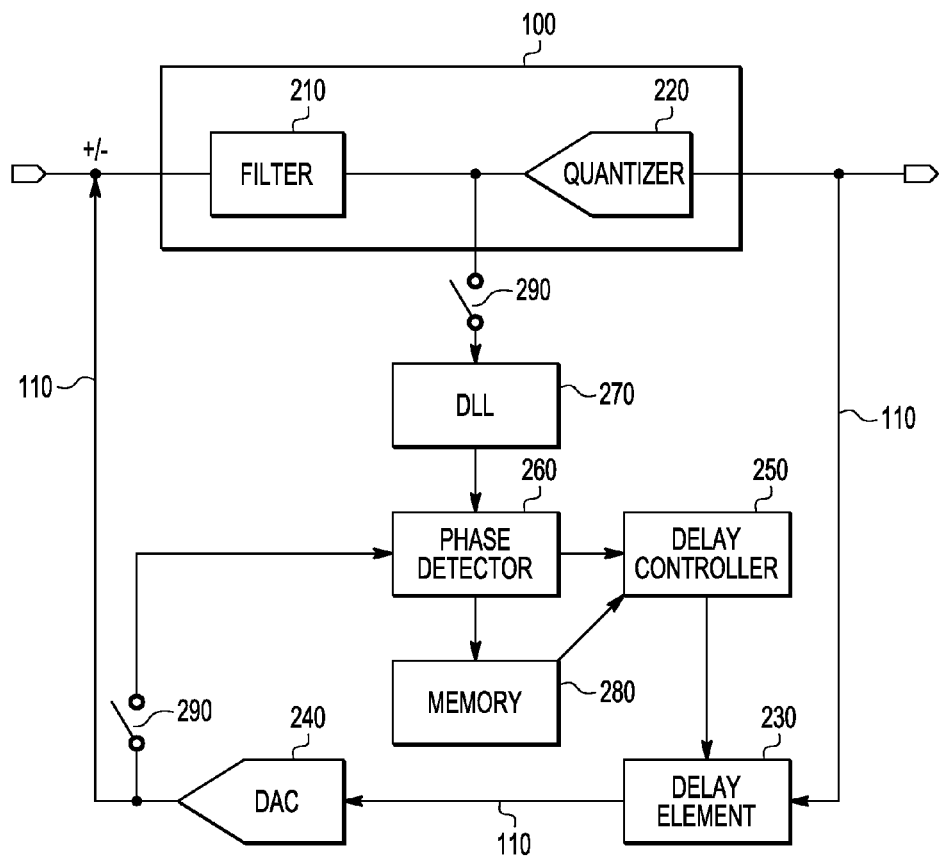
FIG. 2 is a block diagram of an exemplary continuous time sigma delta analog to digital converter, in accordance with an embodiment.

FIG. 2 is a block diagram of an exemplary continuous time sigma delta analog to digital converter 100, in accordance with an embodiment. As discussed above, the continuous time sigma delta modulator 100 may include a filter 210. The filter 210 may be a resistor/capacitor (RC) continuous filter, an inductor/capacitor (LC) continuous filter or a transconductance amplifier/capacitor (gm-C) continuous filter. The filter 210 outputs analog modulated signal with feedback energy. The filter is coupled to a quantizer 220 quantizes the signal into distinct states.

The feedback loop 110 of the continuous time sigma delta modulator 100 includes a delay element 230 and a DAC 240. In one embodiment, for example, the delay element 230 receives the digital output signal generated by the continuous time sigma delta modulator 100. The delay element 230 optimizes a delay in the digital output signal and transmits the digital output signal having the optimized delay to the DAC 240. As discussed above, the DAC 240 may be a NRZ DAC which converts the input digital signal to an analog signal which is added or subtracted back into the continuous time sigma delta MODULATOR 100.

The amount of delay reduction performed by the delay element 230 may be based upon an input control signal. The input control signal is provided by a delay controller 250. In one embodiment, for example, the delay controller 250 may include a charge pump. In other embodiments, for example, the delay controller may include an up/down counter, an exclusive OR gate (XOR gate), or any other suitable circuit element which can produce a voltage to control the delay element 230. The delay controller 250 is, in turn, controller by a phase detector 260. The phase detector 260 is coupled to the output of the DAC 240 and the output of a delay locked loop 270. The phase detector 260 compares the phase of the output of the DAC 240 and the output of a delay locked loop 270 to determine how much excess delay is in the feedback loop 110. The delay locked loop (DLL) 270, similar to a phase locked loop (PLL), outputs a signal corresponding to a phase of signal input to the continuous time sigma delta modulator 100. Accordingly, the phase detector 260 outputs a signal corresponding to the phase difference between the phase of the input analog signal and the phase of the feedback loop, which directly corresponds with the amount of delay that should be added or removed from the feedback loop 110. The phase detector 260 transmits the indication of the delay that should be removed from the feedback loop 110 to the delay controller 250. In turn, the delay controller 250 outputs a control voltage to the delay element 230 which adjusts delay from the delay loop based upon the control voltage.

Figure 3:
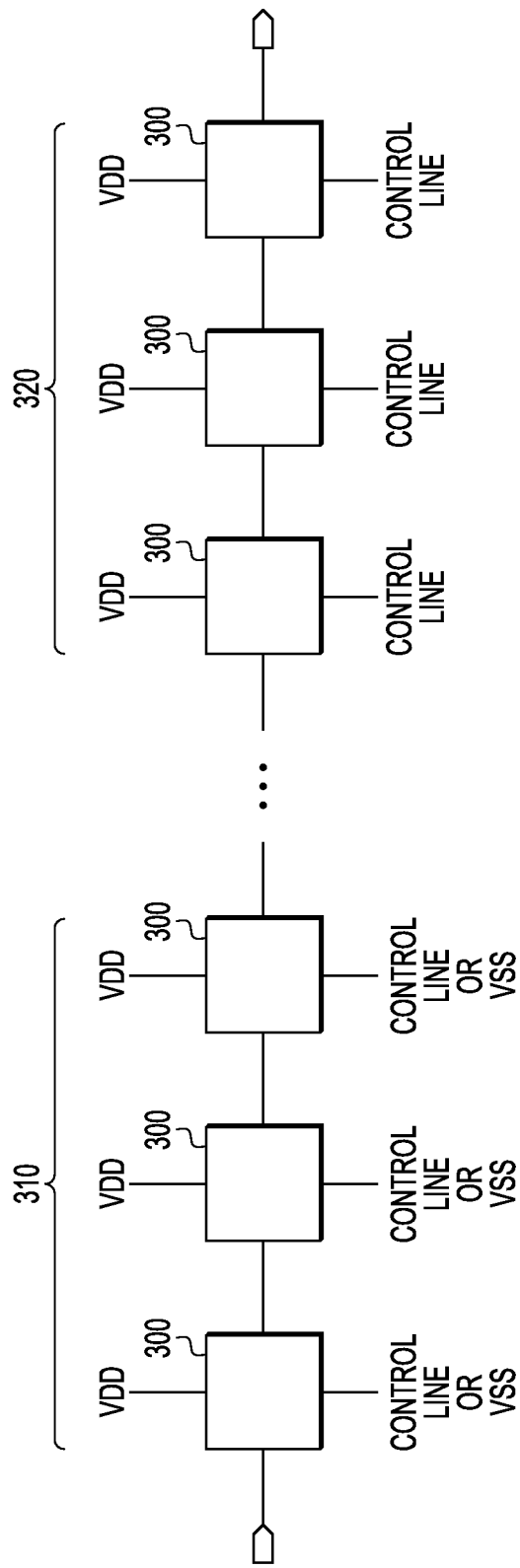
FIG. 3 illustrates an exemplary delay element in accordance with an embodiment.

FIG. 3 illustrates an exemplary delay element 230 in accordance with an embodiment. The delay element 230 includes a series of inverters 300 arranged in series. Each of the inverters 300 receives two control signals. In one embodiment, for example, each of the inverters 300 may receive a reference voltage vdd and a control voltage. The control voltage is received from a delay controller, such as the delay controller 250 illustrated in FIG. 2. In one embodiment, for example, the delay may be controlled by using a current starved inverter. The reduced current in the inverter changes the inverter's gm. The reduced gm of the inverter reduces the total current available to charge the next stage's capacitance. This reduced current translates to a longer delay time. In another embodiment, for example, a first set 310 of inverters 300 may receive a second reference voltage vss rather than the control voltage, and a second set 320 of inverters 300 may receive the control voltage. In one embodiment, for example, the second reference voltage may be a ground reference. In this embodiment, the first set 310 of inverters 300 may add or remove a fixed amount of delay in a feedback loop and the second set 320 may add or remove a variable amount. In other embodiments, for example, the delay elements 230 may be one or more charge pumps or any other timing circuit.

Returning to FIG. 2, as discussed above, the amount of delay in the feedback loop 110 may vary, in part, by variations in the manufacturing process. A successfully manufactured continuous time sigma delta modulator 100 will have a loop delay within a predetermined range. As such, each continuous time sigma delta modulator 100 may have a different loop delay within the predetermined range. In one embodiment, for example, an indication of the amount of delay in the loop caused by the inherent variations in the silicon of each continuous time sigma delta modulator 100 may be stored in a memory 280 during the testing of the continuous time sigma delta modulator 100 by a test device (not illustrated). In one embodiment, for example, the memory 280 may be in the DAC 240, however, the memory 280 may be placed within any of the components of the continuous time sigma delta modulator 100 or as a stand-alone memory. In one embodiment, for example, the amount of delay due to the operating conditions of the continuous time sigma delta modulator 100 (i.e., temperature, etc.) may be determined during a power up sequence of the of the continuous time sigma delta modulator 100. The phase detector 260 may update the memory 280 such that the memory reflects both the amount of delay due to the operating conditions as well as the inherent delay in the feedback loop 110. In one embodiment, for example, the DLL 270 and phase detector 260 may cease operation after the memory 280 is updated to reduce the amount of jitter in the continuous time sigma delta modulator 110. In this embodiment, for example, the DLL 270 and phase detector 260 may be disconnected from the feedback loop using one or more switches 290. The delay controller 250 may be communicatively coupled to the memory 280 and can be configured to read from the memory 280 to determine what control voltage should be transmitted to the delay element 230.

In another embodiment, for example, the amount of delay due to the inherent variations in the silicon of each continuous time sigma delta modulator 100 as well as the operating conditions of the continuous time sigma delta modulator 100 (i.e., temperature, etc.) may be modulator during a power up sequence of the of the continuous time sigma delta modulator 100. In one embodiment, for example, the phase detector 260 may store the indication of the amount of delay that should be removed from a particular feedback loop 110. As noted above, the DLL 270 and phase detector 260 may then cease operations to reduce the amount of jitter in the continuous time sigma delta modulator 110. The delay controller 250 can read from the memory 280 and then output the appropriate control voltage to the delay element 230. In another embodiment, for example, the continuous time sigma delta modulator 100 may periodically or continuously update the amount of delay removed from the feedback loop 110 to account for changes in the delay caused by changes of the operating conditions of the continuous time sigma delta modulator 100. Accordingly, the delay controller 250 can receive the indication of the amount of delay to remove from the feedback loop 110 from the phase detector 260, the memory 280 or a combination thereof.

In one embodiment, for example, a continuous time sigma delta modulator is provided. The continuous time sigma delta modulator may include, but is not limited to, an analog to digital converter having a feedback loop, a delay element coupled to the feedback loop, and a delay controller coupled to the delay element, the delay controller configured to optimize a delay in the feedback loop by controlling the delay element based upon a delay in the feedback loop. In one embodiment, for example, the delay controller may be configured to remove a delay in the feedback loop when optimizing the delay. In one embodiment, for example, the delay element comprises a plurality of various controlled and non-controlled delay elements, wherein a first set of the plurality of delay elements are configured to remove a fixed amount of delay from the feedback loop and a second set of the plurality of delay elements are coupled to the delay controller and are configured to remove a variable amount of delay from the feedback loop based upon a control signal of the delay controller. In one embodiment, for example, the delay controller may be a counter. In another embodiment, for example, the delay controller may be a charge pump. In one embodiment, for example, the continuous time sigma delta modulator may further include a delay locked loop coupled to the analog to digital converter and configured to output a signal indicating the phase of a received analog input signal, and a phase detector communicatively coupled to the feedback loop, the delay controller and the delay locked loop, wherein the phase detector is configured to determine a phase of a feedback loop signal, to compare the determined phase of the feedback loop signal with the phase of the received analog input signal, and to transmit an indication of the difference between the phase of the feedback loop signal with the phase of the received analog input signal to the delay controller, wherein the delay controller controls the delay element based upon the indication of the difference between the phase of the feedback loop signal with the signal indicating the phase of the received analog input signal to the delay controller. In another embodiment, for example, the continuous time sigma delta modulator may further include a register, wherein the delay controller is further configured to control the amount of delay removed from the feedback loop by the delay element based upon a value in the register. In one embodiment, for example, the feedback loop comprises the delay element coupled to the output of the analog to digital converter and a digital to analog converter coupled between an input of the analog to digital converter and the delay element, wherein the digital to analog converter is a non-return-to-zero digital to analog converter.

In another embodiment, for example, an analog to digital converter is provided. The analog to digital converter may include, but is not limited to a feedback loop including, but not limited to, a delay element coupled to an output of the analog to digital converter, and a digital to analog converter coupled between an input of the analog to digital converter and the delay element, wherein the delay element is configured to optimize a delay in the feedback loop. In one embodiment, for example, the analog to digital converter may further include a memory communicatively coupled to the delay element, the memory being configured to store an indication of an amount of delay to be added to or reduced from the feedback loop, wherein the delay element is further configure to optimize the delay in the feedback loop based upon the indication of the amount of delay to be added to or reduced from the feedback loop. In one embodiment, for example, the delay element comprises a plurality of inverters, wherein a first set of the plurality of inverters are configured to reduce a fixed amount of delay from the feedback loop and a second set of the plurality of inverters are configured to add or remove a variable amount of delay from the feedback loop. In one embodiment, for example, the analog to digital converter is a continuous time sigma delta analog to digital converter. In one embodiment, for example, the digital to analog converter is a non-return-to-zero digital to analog converter. In one embodiment, for example, the analog to digital converter may further include a delay controller communicatively coupled to the delay element, wherein the delay controller is configured to communicate a voltage corresponding to an amount of delay to be removed from the feedback loop to the delay element. In one embodiment, for example, the analog to digital converter may further include a delay locked loop coupled to the analog to digital converter and configured to output a signal indicating the phase of a received analog input signal, and a phase detector communicatively coupled to the digital to analog converter, the delay controller, and the delay locked loop, wherein the phase detector is configured to determine a phase of a signal output from the digital to analog converter, to compare the determined phase of the digital to analog converter signal with the phase of the received analog input signal, and to transmit an indication of the difference between the phase of the digital to analog converter signal with the phase of the received analog input signal to the delay controller. In one embodiment, for example, the analog to digital converter may further include a memory communicatively coupled to the delay controller and the delay element, wherein the delay controller is configured to store the indication of the difference between the phase of the digital to analog converter signal with the phase of the received analog input signal in the memory, and the delay element is configured to reduce the delay in the feedback loop based upon the indication of the difference between the phase of the digital to analog converter signal with the phase of the received analog input signal stored in the memory.

While the above description discusses a system and method for optimizing a delay in a delay loop of a continuous time sigma delta modulator, one of ordinary skill in the art would recognize that any system which is sensitive to loop delay could benefit from the disclosed delay optimization system.

The term "exemplary" is used herein to represent one example, instance or illustration that may have any number of alternates. Any implementation described herein as "exemplary" should not necessarily be construed as preferred or advantageous over other implementations.

Although several exemplary embodiments have been presented in the foregoing description, it should be appreciated that a vast number of alternate but equivalent variations exist, and the examples presented herein are not intended to limit the scope, applicability, or configuration of the embodiments in any way. To the contrary, various changes may be made in the function and arrangement of the various features described herein without departing from the scope of the claims and their legal equivalents.

What is claimed is:

1. A continuous time sigma delta modulator, comprising:
   an analog to digital converter including a feedback loop, wherein the feedback loop comprises a delay element; and
   a delay controller configured to be coupled to the delay element, the delay controller configured to adjust a delay in the feedback loop by controlling the delay element based upon a delay in the feedback loop,
   wherein the delay element comprises a plurality of controlled and non-controlled delay elements, and a first set of the plurality of delay elements are configured to remove a fixed amount of delay from the feedback loop and a second set of the plurality of delay elements are coupled to the delay controller and are configured to remove a variable amount of delay from the feedback loop based upon a control signal of the delay controller.

2. The continuous time sigma delta modulator of claim 1, wherein the delay controller is configured to remove a delay in the feedback loop when optimizing the delay.

3. A continuous time sigma delta modulator, comprising:
   an analog to digital converter including a feedback loop, wherein the feedback loop comprises a delay element; and
   a delay controller configured to be coupled to the delay element, the delay controller configured to adjust a delay in the feedback loop by controlling the delay element based upon a delay in the feedback loop,
   wherein the delay controller includes a counter.

4. A continuous time sigma delta modulator, comprising:
   an analog to digital converter including a feedback loop, wherein the feedback loop comprises a delay element; and
   a delay controller configured to be coupled to the delay element, the delay controller configured to adjust a delay in the feedback loop by controlling the delay element based upon a delay in the feedback loop,
   wherein the delay controller includes a charge pump.

5. A continuous time sigma delta modulator, comprising:
   an analog to digital converter including a feedback loop, wherein the feedback loop comprises a delay element;
   a delay controller configured to be coupled to the delay element, the delay controller configured to adjust a delay in the feedback loop by controlling the delay element based upon a delay in the feedback loop;

a delay locked loop configured to be coupled to the analog to digital converter and configured to output a signal indicating the phase of a received analog input signal; and a phase detector configured to be coupled to the feedback loop, the delay controller and the delay locked loop, wherein the phase detector is configured to compare a determined phase of the feedback loop signal with the phase of the received analog input signal, and to transmit an indication of the difference between the phase of the feedback loop signal with the phase of the received analog input signal to the delay controller.

6. The continuous time sigma delta modulator of claim 5, wherein the delay controller controls the delay element based upon the indication of the difference between the phase of the feedback loop signal with the signal indicating the phase of the received analog input signal to the delay controller.

7. A continuous time sigma delta modulator, comprising:
an analog to digital converter including a feedback loop, wherein the feedback loop comprises a delay element;
a delay controller configured to be coupled to the delay element, the delay controller configured to adjust a delay in the feedback loop by controlling the delay element based upon a delay in the feedback loop; and
a memory, wherein the delay controller is further configured to control the amount of delay removed from the feedback loop by the delay element based upon a value in the memory.

8. A continuous time sigma delta modulator, comprising:
an analog to digital converter including a feedback loop, wherein the feedback loop comprises a delay element; and
a delay controller configured to be coupled to the delay element, the delay controller configured to adjust a delay in the feedback loop by controlling the delay element based upon a delay in the feedback loop,
wherein the feedback loop comprises the delay element coupled to the output of the analog to digital converter and a digital to analog converter coupled between an input of the analog to digital converter and the delay element.

9. The continuous time sigma delta modulator of claim 8, wherein the digital to analog converter is a non-return-to-zero digital to analog converter.

10. An analog to digital converter, comprising:
a feedback loop, comprising:
a delay element coupled to an output of the analog to digital converter; and
a digital to analog converter coupled between an input of the analog to digital converter and the delay element,
wherein the delay element is configured to optimize a delay in the feedback loop; and
a memory communicatively coupled to the delay element, the memory being configured to store an indication of an amount of delay to provide to the feedback loop, wherein the delay element is programmable to adjust the delay in the feedback loop based upon the indication of the amount of delay to be provided to feedback loop.

11. The analog to digital converter of claim 10, wherein the delay element comprises a plurality of inverters.

12. An analog to digital converter, comprising:
a feedback loop, comprising:
a delay element coupled to an output of the analog to digital converter; and
a digital to analog converter coupled between an input of the analog to digital converter and the delay element,
wherein the delay element is configured to optimize a delay in the feedback loop,
wherein the delay element comprises a plurality of inverters and a first set of the plurality of inverters are configured to reduce a fixed amount of delay from the feedback loop and a second set of the plurality of inverters are configured to provide a variable amount of delay from the feedback loop.

13. The analog to digital converter of claim 10, wherein the analog to digital converter is a continuous time sigma delta analog to digital converter.

14. An analog to digital converter, comprising:
a feedback loop, comprising:
a delay element coupled to an output of the analog to digital converter; and
a digital to analog converter coupled between an input of the analog to digital converter and the delay element,
wherein the delay element is configured to optimize a delay in the feedback loop,
wherein the digital to analog converter is a non-return-to-zero digital to analog converter.

15. An analog to digital converter, comprising:
a feedback loop, comprising:
a delay element coupled to an output of the analog to digital converter; and
a digital to analog converter coupled between an input of the analog to digital converter and the delay element,
wherein the delay element is configured to optimize a delay in the feedback loop; and
a delay controller communicatively coupled to the delay element, wherein the delay controller is configured to communicate a voltage corresponding to an amount of delay to be removed from the feedback loop to the delay element.

16. The analog to digital converter of claim 15, further comprising:
a delay locked loop coupled to the analog to digital converter and configured to output a signal indicating the phase of a received analog input signal; and
a phase detector communicatively coupled to the digital to analog converter, the delay controller, and the delay locked loop, wherein the phase detector is configured to compare a determined phase of the digital to analog converter signal with the phase of the received analog input signal, and to transmit an indication of the difference between the phase of the digital to analog converter signal with the phase of the received analog input signal to the delay controller.

17. The analog to digital converter of claim 16, further comprising a memory communicatively coupled to the delay controller and the delay element, wherein the delay controller is configured to store the indication of the difference between the phase of the digital to analog converter signal with the phase of the received analog input signal in the memory, and the delay element is configured to reduce the delay in the feedback loop based upon the indication of the difference between the phase of the digital to analog converter signal with the phase of the received analog input signal stored in the memory.

* * * * *